(12) United States Patent
Kang et al.

(10) Patent No.: US 7,405,167 B2
(45) Date of Patent: Jul. 29, 2008

(54) METHOD OF MANUFACTURING NONVOLATILE ORGANIC MEMORY DEVICE AND NONVOLATILE ORGANIC MEMORY DEVICE MANUFACTURED BY THE SAME

(75) Inventors: Yoon Sok Kang, Seongnam-si (KR); Sang Kyun Lee, Seongnam-si (KR); Won Jae Joo, Hwaseong-si (KR); Kwang Hee Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 323 days.

(21) Appl. No.: 11/214,724

(22) Filed: Aug. 31, 2005

(65) Prior Publication Data

US 2006/0141703 A1    Jun. 29, 2006

(30) Foreign Application Priority Data

Dec. 24, 2004    (KR) .................... 10-2004-0111926

(51) Int. Cl.
*H01L 21/31*    (2006.01)
*H01L 21/469*    (2006.01)

(52) U.S. Cl. ................... 438/780; 438/99; 438/396; 257/E21.008; 257/E21.35; 257/E21.396

(58) Field of Classification Search .................. 438/99, 438/381, 393, 396, 778, 780, 781, 783, FOR. 135, 438/FOR. 430; 257/E21.007, E21.008, E21.299, 257/E21.35, E21.393
See application file for complete search history.

(56) References Cited

U.S. PATENT DOCUMENTS 6,055,180 A      4/2000  Gudesen et al.
6,159,620 A  *  12/2000  Heath et al. ................. 428/615
2002/0163057 A1  11/2002  Bulovic et al.

FOREIGN PATENT DOCUMENTS

JP           62-095882      5/1987
JP          2002-163057     6/2002

* cited by examiner

*Primary Examiner*—Fernando L. Toledo
*Assistant Examiner*—Quovaunda Jefferson
(74) *Attorney, Agent, or Firm*—Buchanan Ingersoll & Rooney PC

(57) ABSTRACT

A method of manufacturing a nonvolatile organic memory device including a memory layer interposed between an upper electrode layer and a lower electrode layer, which includes dispersing ions of conductive nanoparticles in an organic material disposed between the two electrode layers and then reducing the ions of conductive nanoparticles into conductive nanoparticles in the organic material to form a desired memory layer. In addition, a nonvolatile organic memory device manufactured by the method of the current invention is also provided. The method allows the memory device to be manufactured using a rapid, simple, and environmentally friendly process, without the need for an encapsulation process. As well, the memory device has a low operating voltage, and hence, is suitable for application to various portable electronic devices that must have low power consumption.

26 Claims, 3 Drawing Sheets

Conventional dispersion

Synthesizing Nanoparticles

Blending

Spin Coating

Dipping substrate with organic material into ionic solution of conductive nanoparticles and reducing to form conductive nanoparticles Novel dispersion Spin coating organic material ns # US 7,405,167 B2

METHOD OF MANUFACTURING NONVOLATILE ORGANIC MEMORY DEVICE AND NONVOLATILE ORGANIC MEMORY DEVICE MANUFACTURED BY THE SAME

BACKGROUND OF THE INVENTION

This non-provisional application claims priority under 35 U.S.C. § 119(a) on Korean Patent Application No. 2004-111926 filed on Dec. 24, 2004, which is herein expressly incorporated by reference.

1. Field of the Invention

Embodiments of the present invention relate, generally, to a method of manufacturing a nonvolatile organic memory device and a nonvolatile organic memory device manufactured by the same. More particularly, embodiments of the present invention relate to a method of manufacturing a nonvolatile organic memory device, which is advantageous because it is environmentally friendly and has superior processability by dispersing ions of conductive nanoparticles in an organic material disposed between two electrode layers and reducing the ions of conductive nanoparticles into conductive nanoparticles in the organic material, and a nonvolatile organic memory device, having a low operating voltage, manufactured by such a method.

2. Description of the Related Art

With the rapid development of the information and communication industries, the demand for various memory devices has drastically increased. In particular, memory devices used for portable terminals, various smart cards, electronic money, digital cameras, games, MP3 players, etc. must be nonvolatile, so that the recorded information is not lost even when not consuming any power. A typical representative of the nonvolatile memory is flash memory, which is formed of a silicon material and has monopolized the memory market.

However, conventional flash memory is disadvantageous because it has a limited number of recording/erasing times and a slow recording speed. Further, in order to manufacture flash memory having a high memory capacity, line width per unit area should be decreased, which increases process costs resulting in high costs to manufacture memory chips. Moreover, due to difficulties in chip manufacturing techniques it is difficult to further miniaturize the chips. Due to technical limitations imposed on manufacturing the conventional silicon flash memory, attempts to develop next generation nonvolatile memory devices, which realize ultrahigh speeds, high capacities, low power consumption, and low prices while overcoming the physical limitations of the above memory devices, have been vigorously made.

The next-generation memory devices include, for example, ferroelectric RAM, magnetic RAM, phase change RAM, nanotube memory, holographic memory, organic memory, etc., depending on the kind of material constituting a unit cell in a semiconductor. Of these memory devices, organic memory achieves memory capability using bistable resistance values caused by applying voltage to an organic material layer positioned between upper and lower electrode layers. That is, the organic memory is a type of memory that is able to read and write data '0' and '1' while the resistance of the organic material present between the upper and lower electrode layers is reversibly changed in response to electrical signals. Thus, the organic memory functions to solve the problems of processability, manufacturing costs and integration, while exhibiting the nonvolatile characteristics of conventional flash memory, and is widely expected to be the next generation memory technology.

In this regard, Japanese Patent Laid-open Publication No. Sho. 62-95882 discloses an electrical memory device using CuTCNQ (7,7,8,8-tetracyano-p-quinodimethane) as a charge transfer complex containing an organic metal. U.S. Published Patent Application No. US 2002/0163057 discloses a semiconductor device including a middle layer made of a mixture of an ionic salt such as NaCl or CsCl and a conductive polymer, interposed between upper and lower electrode layers. Such a device manifests switching/memory properties by charge separation in an electrical field. In addition, U.S. Pat. No. 6,055,180 discloses a memory device using ferroelectricity depending on a crystalline phase of a fluorine based polymer, such as poly(vinyldifluoroethylene).

On the other hand, the manufacturing method of the conventional organic memory device further includes an electroforming process, which applies high voltage to the manufactured memory device. As such, the electroforming process is used to pulverize a metal for an electrode to ones of nm size and then allow the pulverized metal to move between organic layers (*J. Phys. D:Appl. Phys.*, 35, 802 (2002)). In the electroformed memory device, an NDR (Negative Differential Resistance) section is formed, thus manifesting memory properties. However, since the electroforming process cannot control the size or size distribution of metal particles, physical properties of the devices are inconsistent. At this time, memory behavior, as well as the operating voltage and operating current of the memory device, varies and contributes to inconsistent device properties, which reduces the reproducibility and results in severely defective products.

To solve the above problems, methods of dispersing nanoparticles in an organic insulating layer by synthesizing nanoparticles and blending the synthesized nanoparticles with a polymer have been proposed (IBM, MRS meeting, 2004 spring). As such, however, the nanoparticles may aggregate due to mutual attraction, losing the properties of nanoparticles. To prevent aggregation of nanoparticles, although a process of encapsulating the nanoparticles is additionally performed between the synthesizing of nanoparticles and the blending of the synthesized nanoparticles with the polymer, such an encapsulation process suffers from a shortcoming of requiring several days or more. In addition, the nanoparticles may aggregate again when being dispersed in the medium, and also, a large amount of solvent is used, thus causing environmental contamination problems.

OBJECTS AND SUMMARY

Accordingly, embodiments of the present invention have been made keeping in mind the above problems occurring in the related art, and an object of embodiments of the present invention is to provide a method of manufacturing a nonvolatile organic memory device, which method allows conductive nanoparticles to rapidly and uniformly disperse in an organic material using in-situ dispersion of an ionic solution of conductive nanoparticles.

Another object of embodiments of the present invention is to provide a method of manufacturing a nonvolatile organic memory device having environmentally friendly properties and a low operating voltage.

A further object of embodiments of the present invention is to provide a nonvolatile organic memory device manufactured by the above method.

In order to accomplish the above objects, embodiments of the present invention provide a method of manufacturing a nonvolatile organic memory device including a memory layer interposed between an upper electrode layer and a lower electrode layer, the method comprising dispersing ions of conductive nanoparticles in organic material disposed between the upper and lower electrode layers, and then reducing the ions of conductive nanoparticles into conductive nanoparticles in the organic material, to form a desired memory layer.

In addition, embodiments of the present invention provide a nonvolatile organic memory device manufactured by a method of embodiments of the present invention.

BRIEF DESCRIPTION OF THE DRAWINGS

The above and other objects, features and advantages of embodiments of the present invention will be more clearly understood from the following detailed description taken in conjunction with the accompanying drawings, in which.

DETAILED DESCRIPTION OF THE PREFERRED EMBODIMENTS

Figure 1:
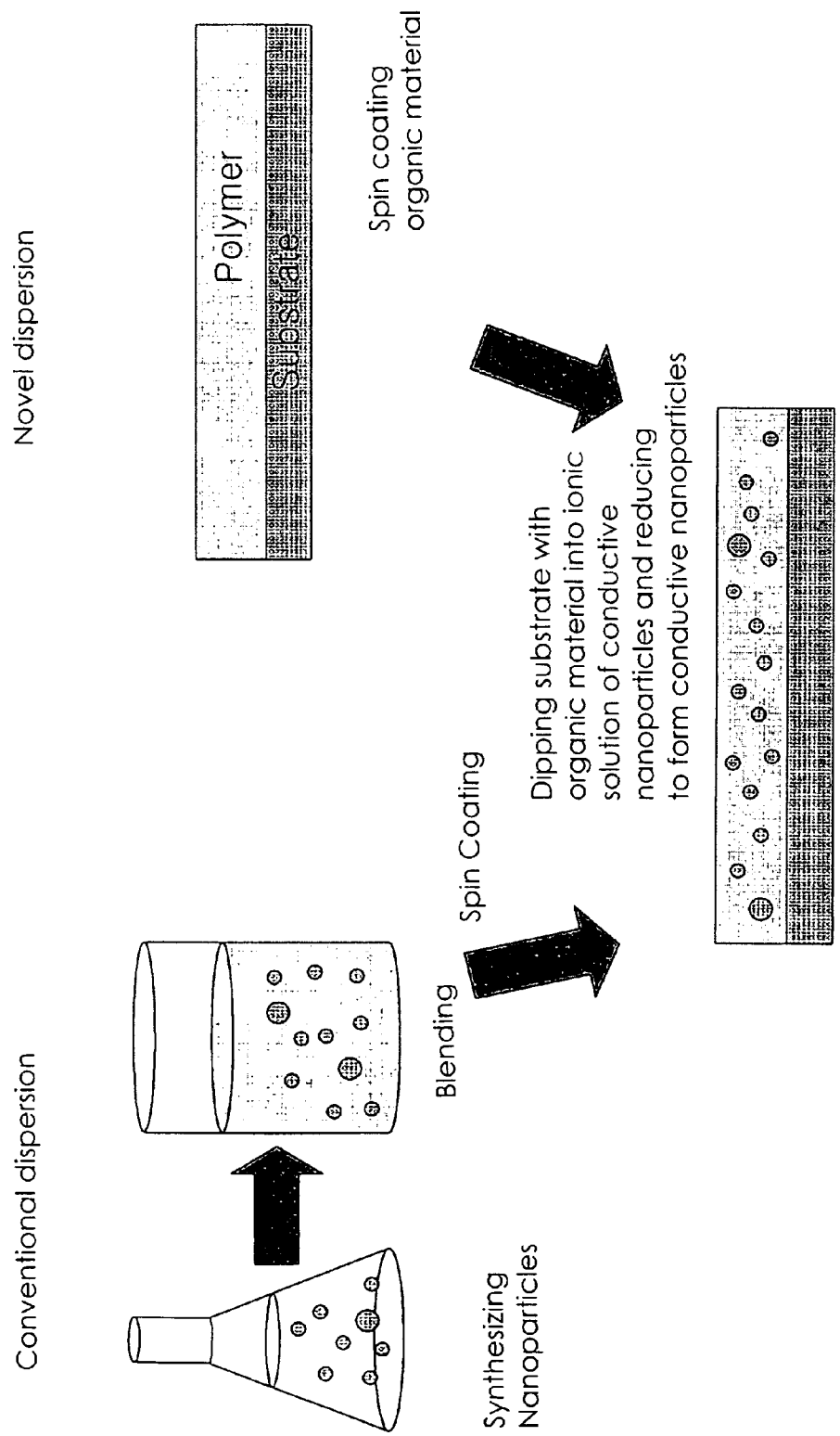
FIG. 1 is a view showing a conventional dispersion process and an in-situ dispersion process of conductive nanoparticles of embodiments of the present invention.

Hereinafter, a detailed description will be given of embodiments of the present invention, with reference to the appended drawings.

According to an embodiment of the present invention, a method of manufacturing a nonvolatile organic memory device comprising a memory layer sandwiched between an upper electrode layer and a lower electrode layer is provided, in which the memory layer of the organic memory device is formed by dispersing ions of conductive nanoparticles in an organic material disposed between the two electrode layers and then reducing the ions of conductive nanoparticles into conductive nanoparticles in the organic material. In the case where the memory layer is formed using a process of dispersing conductive nanoparticles in-situ, the organic material may be first applied on the substrate having a lower electrode layer formed thereon. That is, a polymer solution may be spin coated on the substrate and baked to form the organic material layer. As such, the organic material layer may be formed in a monolayer or multiple layers composed of two or more layers. If the organic material layer is made of multiple layers, the conductive nanoparticles may be dispersed in only one layer of the multiple layers. Subsequently, the substrate having the organic material layer formed thereon is dipped into an ionic solution of conductive nanoparticles for a predetermined time so that the ions of conductive nanoparticles are dispersed in the polymer. Then, the substrate thus obtained is treated with the reducing agent, to form a desired memory layer.

As a polymer that is usable in embodiments of the present invention, the organic material preferably includes any polymer able to specifically interact with a metal ion. Such a polymer is exemplified by poly(n-vinylpyridine), poly(dimethylsiloxane), poly(ethylene-oxide), poly(acrylic acid), poly(methylacrylic acid), poly(styrene-sulfonic acid), poly(cyclopentadienylmethyl-norbornene), and poly(amino acid), but is not limited thereto.

In embodiments of the present invention, the properties of the memory device may vary with the type of organic material. For example, when a poly(styrene-vinylpyridine) random copolymer is used, size and concentration of the nanoparticles are controlled, depending on the amount of the vinylpyridine group. In addition, in the case where a polymer having a functional group other than vinylpyridine is used, various metal ions may be used. Further, when poly(styrene-b-vinylpyridine) block copolymer is used, the organic material disposed between the upper and lower electrode layers may be formed into multiple layers, one of which has the metal nanoparticles dispersed therein.

The conductive nanoparticles may be selected from the group consisting of metals, metal oxides, semiconductors, conductive polymers, organic conductors, and combinations thereof. In particular, since the metal is present in the form of metal salt, any metal may be used so long as it may be dissolved in a polar solvent. The metal is exemplified by Au, Ag, Cu, Al, Ti, Pd, Ca, Pt, Pb, Zn, Ph, Co, Ni, Cd, Fe, and combinations thereof.

The ionic solution of conductive nanoparticles is formed by dissolving, in the polar solvent, at least one material selected from the group consisting of $HAuCl_4$, $LiAuCl_4$, $AuCl_3$, $Au(PMe_3)Me$, $H_2PtCl_6$, $Pt(Cp)Me_3$, $PbCl_2$, $ZnCl_2$, $Cu(OAc)_2$, $Cu(ClO_4)_2$, $Na_2PdCl_4$, $Pd(Cp)PA$, $Pd(OAc)_2$, $Rh(OAc)_2$, $CoCl_2$, $Co_2(CO)_8$, $NiCl_2$, $AgOAc$, $AgClO_4$, $AgNO_3$, $Cd(ClO_4)_2$, $CdMe_2$, $Pb(ClO_4)_2$, $PbEt_4$, $PbCl_2$, $ZnEt_2$, $Cu(OAc)_2$, $CoCl_2$, $FeCl_2$, and $FeCl_2/FeCl_3$, but not limited thereto.

The reducing agent used in embodiments of the present invention includes, for example, $NaBH_4$, $LiBH_4$, $LiAlH_4$, $LiBEt_3H$, alkylsilane, Raney Ni, $Pd+H_2$, $FeCl_3$, $H_2S$, hydrazine, or $SnCl_2+HCl$, but is not limited thereto.

The organic material used in embodiments of the present invention should have a reactive group able to interact with a metal ion. Preferably, such an organic material is a polymer containing an amine group. For example, pyridine of polyvinylpyridine is a tertiary amine group, which thus serves as a linking site of an $Au^{3+}$ ion. Thus, for example, a substrate having an organic material layer formed by applying an organic material (e.g. polyvinyl pyridine) on the substrate is dipped into a solution containing a metal ion (e.g., $HAuCl_4$), whereby the metal ion forms a complex with a reactive group of the organic material (e.g. a pyridine unit) while being dispersed in the polymer. Then, by treating the memory device with a reducing agent, the ions (e.g. $Au^{3+}$ ions) are reduced into nanoparticles (e.g. Au nanoparticles). As such, since this reaction occurs not in a solution but in a solid, the diffusion distance of ions is restricted, and hence, the sizes of nanoparticles become uniform. The conductive nanoparticles thus obtained function as a charge trapping site between the upper and lower electrode layers. Thereby, the memory device manufactured by the method of embodiments of the present invention manifests excellent memory properties.

Figure 2:
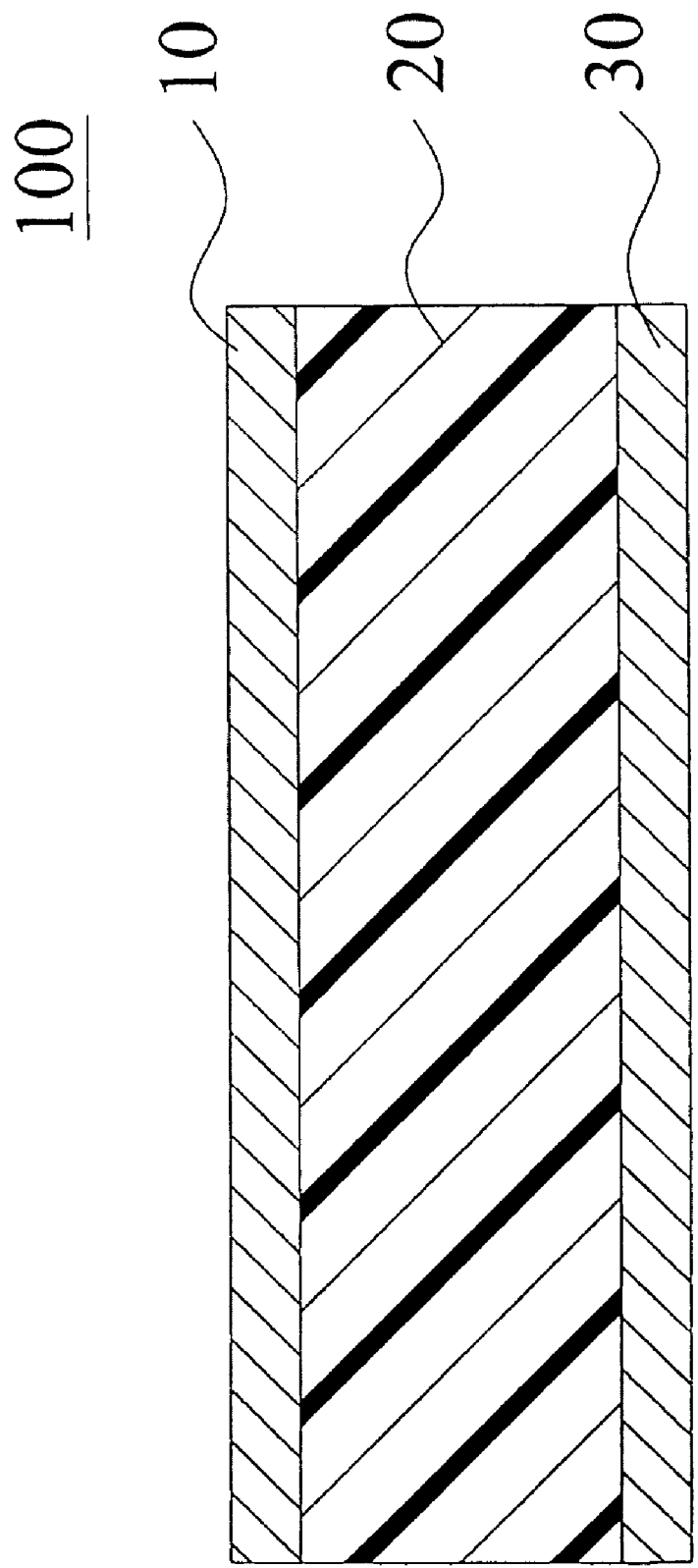
FIG. 2 is a schematic sectional view showing a nonvolatile organic memory device manufactured using a method of embodiments of the present invention.

With regard to FIG. 2, the memory layer 20 of embodiments of the present invention may be formed using a spin coating process, an inkjet printing process, a roll-to-roll coating process, a thermal deposition process, etc. The memory layer 20 is preferably about 50 to 3000 Å thick, more preferably 150 to 1000 Å thick. The solvent used for spin coating may be selected from the group consisting of acetone, cyclopentanone, cyclohexanone, methylethylketone ethylcellosolveacetate, butylacetate, ethyleneglycol, toluene, xylene, chloroform, tetrahydrofuran, dimethylformamide, chlorobenzene and acetonitrile. In addition, of the above solvents, two or more solvents may be mixed at predetermined ratios.

The upper electrode layer 10 and the lower electrode layer 30 may be formed of an electrically conductive material selected from the group consisting of metals, metal alloys, metal nitrides, metal oxides, metal sulfides, carbon and conductive polymers, organic conductors, and combinations thereof. The electrode material includes, for example, aluminum (Al), gold (Au), silver (Ag), platinum (Pt), copper (Cu), titanium (Ti), tungsten (W), or indium tin oxide (ITO), but is not limited thereto. In the case where the electrode layer is formed of an organic material, the memory device is formed only of the organic material, yielding a complete organic memory device.

The conductive polymer includes, for example, phenylpolyacetylene polymers, such as polydiphenylacetylene, poly(t-butyl)diphenylacetylene, poly(trifluoromethyl)diphenylacetylene, poly(bistrifluoromethyl) acetylene, polybis(t-butyldiphenyl)acetylene, poly(trimethylsillyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsillyl)phenylacetylene and derivatives thereof, or polythiophenes.

The electrode layer is typically formed using a deposition process such as thermal deposition, a sputtering process, an e-beam evaporation process, a spin coating process, etc.

According to an embodiment of the present invention, a method of manufacturing a nonvolatile organic memory device is provided, in which a barrier layer is further formed on the lower electrode layer 30 to prevent the lower electrode layer 30 from damage due to the organic material generating a metal ion. The barrier layer may include a material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$. Preferably, the barrier layer includes a material selected from the group consisting of $SiO_2$, $Al_2O_3$, $Cu_2O$, $TiO_2$, $BN$, and $V_2O_3$. The barrier layer of embodiments of the present invention may be formed of an organic material, such as Alq3, polymethylmethacrylate, polystyrene, PET, etc. The barrier layer is preferably 20 to 300 Å thick.

In addition, embodiments of the present invention provide a nonvolatile organic memory device manufactured by embodiments of the inventive method. As shown in FIG. 2, the nonvolatile organic memory device 100 includes an upper electrode layer 10, a lower electrode layer 30, and a memory layer 20 sandwiched between the upper electrode layer 10 and the lower electrode layer 30. In the memory device 100, the conductive nanoparticles, preferably uniformly dispersed in the organic material, serve as a charge trapping site. Thus, when voltage is applied to the memory device, resistance values of the memory layer exhibit bistability and, therefore, realize desired memory properties. A memory device of embodiments of the present invention stores information using variation in the electrical resistance of the memory layer 20 thereof, and thus, is nonvolatile. Accordingly, a memory device of embodiments of the present invention may be applied to portable terminals, various smart cards, electronic money, digital cameras, games, MP3 players, etc.

A better understanding of embodiments of the present invention may be obtained in light of the following examples which are set forth to illustrate, but are not to be construed to limit the present invention.

EXAMPLE 1

On a glass substrate having a lower electrode layer formed by depositing aluminum on the substrate, a solution of poly(styrene-b-vinylpyridine) (molecular weight of each block: 57,000) was spin coated and then baked at 120° C. for 20 min. The coated substrate was dipped into a 1 wt % $HAuCl_4$ ethanol solution for about 1 min and washed several times with deionized water. Subsequently, the substrate was dipped into 1 wt % $NaBH_4$ methanol solution for about 15 sec, washed several times with deionized water, and dried overnight at 60° C. in a vacuum atmosphere. Upon observing the surface of the dried substrate, the substrate was confirmed to be suitable for formation of another electrode layer from the result that the substrate was still flat, without being roughened by the solution. Thereafter, as an upper electrode layer, aluminum was deposited on the substrate using a thermal evaporation process, to manufacture a nonvolatile organic memory device. As such, the memory layer was 15-100 nm thick, and the electrode layers were 50-100 nm thick, in which the thickness of each layer was measured using an alpha-step profilometer. The thickness of the electrode layer was controlled using a quartz crystal monitor.

Figure 3:
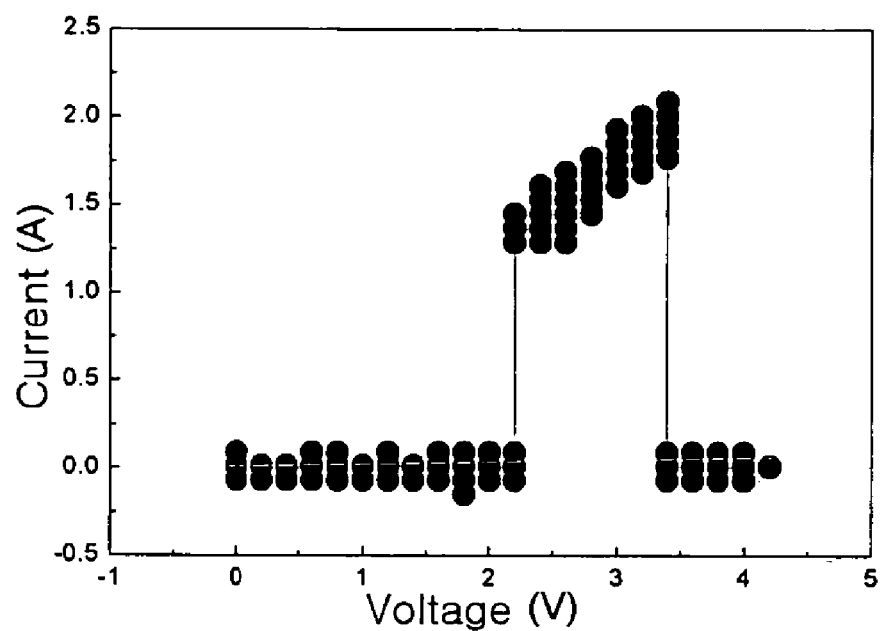
FIG. 3 is a graph showing current-voltage (I-V) of a memory device manufactured according to an embodiment of the present invention.

The current-voltage (I-V) curve of the above device is shown in FIG. 3. As such, the voltage scan is 0.1 volt/sweep. As shown in FIG. 3, at a first bias sweep, current is drastically increased at about 2.2 V, and thus the device is in a set state. Then, when the current is drastically decreased at 3.4 V, the device is in a reset state. The two states of the device differ in their current by 2 orders of magnitude. The current of the memory device is maintained high even at a low voltage through a second sweep following the voltage sweep of the device in the set state. Thus, the memory device manifests bistability having two different resistance values at the same applied voltage. Since the two different resistance states are readable using a low reading voltage, this device is found to be usable as a nonvolatile memory device.

EXAMPLE 2

On a glass substrate, aluminum was deposited using a thermal evaporation process to form a lower electrode layer, which was then spin coated with PMMA to form a 20 nm thick barrier layer. Subsequently, on the glass substrate having the barrier layer formed thereon, a solution of poly(styrene-b-vinylpyridine) (molecular weight of each block: 57,000) was spin coated and then baked at 120° C. for 20 min to form an organic material layer. The substrate coated with the organic material was dipped into a 1 wt % $Au(PMe_3)Me$ ethanol solution for about 1 min and washed several times with deionized water. Subsequently, the substrate was dipped into a 1 wt % $NaBH_4$ methanol solution for about 15 sec, washed several times with deionized water, and dried overnight at 60° C. in a vacuum atmosphere. Then, as an upper electrode layer, aluminum was deposited on the substrate using a thermal evaporation process, to manufacture a nonvolatile organic memory device. As such, the memory layer was 15-100 nm thick, and the electrode layers were 50-100 nm thick, in which the thickness of each layer was measured using an alpha-step profilometer. The thickness of the electrode layer to be deposited was controlled using a quartz crystal monitor.

Figure 4:
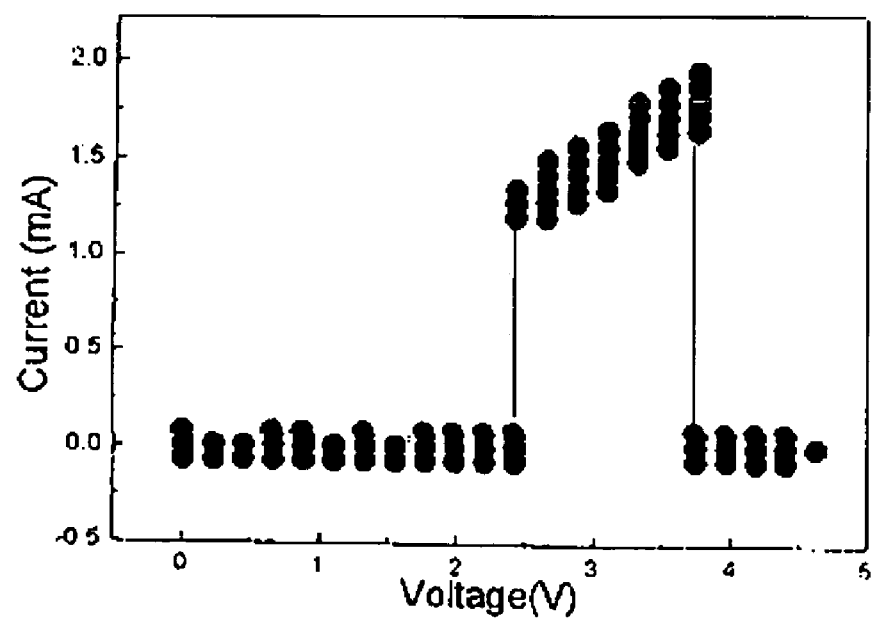
FIG. 4 is a graph showing current-voltage (I-V) of a memory device manufactured according to an embodiment of the present invention.

The current-voltage (I-V) curve of the above device is shown in FIG. 4. The voltage scan is 0.1 volt/sweep. As shown in FIG. 4, the memory device of an embodiment of the present invention is found to exhibit bistability and usability as a nonvolatile memory device.

As described hereinbefore, embodiments of the present invention provide a method of manufacturing a nonvolatile organic memory device and a nonvolatile organic memory device manufactured by embodiments of the method. In a method of embodiments of the present invention, since a process of encapsulating nanoparticles may be omitted, the process of manufacturing an organic memory device is greatly simplified. Further, the process time is decreased to about 1/50-1/200 of the original time, due to omission of the encapsulation process. Also, less solvent may be used for synthesis, and hence, a method of embodiments of the present invention is environmentally friendly, and has higher reproducibility than methods using electroforming. In addition, the operating voltage of a memory device thus manufactured is remarkably decreased. Accordingly, a memory device of embodiments of the present invention is suitable for application in portable electronic devices that must have low power consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a nonvolatile organic memory device comprising a memory layer interposed between an upper electrode layer and a lower electrode layer, the method comprising:
   forming an organic material layer on a substrate having a lower electrode layer formed thereon, wherein the organic material is a polymer wherein ions form a complex with a reactive group of the polymer;
   dipping the substrate having the organic material layer formed thereon into an ionic solution of conductive nanoparticles, wherein the reactive group of the polymer interacts with the ions of conductive nanoparticles to form the complex; and
   treating the dipped substrate with a reducing agent thereby reducing the ions of conductive nanoparticles into conductive nanoparticles in the organic material layer to form the memory layer.

2. The method as set forth in claim 1, wherein the conductive nanoparticles are selected from the group consisting of metals, metal oxides, semiconductors, conductive polymers, and organic conductors.

3. The method as set forth in claim 1, wherein the ionic solution of conductive nanoparticles is formed by dissolving, in a polar solvent, at least one material selected from the group consisting of $HAuCl_4$, $LiAuCl_4$, $AuCl_3$, $Au(PMe_3)Me$, $H_2PtCl_6$, $Pt(Cp)Me_3$, $PbCl_2$, $ZnCl_2$, $Cu(OAc)_2$, $Cu(ClO_4)_2$, $Na_2PdCl_4$, $Pd(Cp)PA$, $Pd(OAc)_2$, $Rh(OAc)_2$, $CoCl_2$, $Co_2(CO)_8$, $NiCl_2$, $AgOAc$, $AgClO_4$, $AgNO_3$, $Cd(ClO_4)_2$, $CdMe_2$, $Pb(ClO_4)_2$, $PbEt_4$, $PbCl_2$, $ZnEt_2$, $Cu(OAc)_2$, $CoCl_2$, $FeCl_2$, and $FeCl_2/FeCl_3$.

4. The method as set forth in claim 1, wherein the polymer is a homopolymer or a copolymer composed of a material selected from the group consisting of poly(n-vinylpyridine), poly(dimethylsiloxane), poly(ethylene-oxide), poly(acrylic acid), poly(methylacrylic acid), poly(styrene-sulfonic acid), poly(cyclopentadienylmethyl-norbornene), and poly(amino acid).

5. The method as set forth in claim 1, wherein the organic material is a polymer containing an amine group.

6. The method as set forth in claim 5, wherein the polymer containing an amine group is a homopolymer or a copolymer having a vinylpyridine group.

7. The method as set forth in claim 6, wherein the copolymer is a random copolymer or a block copolymer.

8. The method as set forth in claim 1, wherein the reducing agent is selected from the group consisting of $NaBH_4$, $LiBH_4$, $LiAlH_4$, $LiBEt_3H$, alkylsilane, Raney Ni, a mixture of Pd and $H_2$, $FeCl_3$, $H_2S$, hydrazine, and a mixture of $SnCl_2$ and HCl.

9. The method as set forth in claim 1, wherein the organic material layer consists of a monolayer.

10. The method as set forth in claim 1, wherein the organic material layer comprises multiple layers.

11. The method as set forth in claim 1, wherein the memory layer has a thickness ranging from about 50 to 3000 Å.

12. The method as set forth in claim 1, wherein the memory layer has a thickness ranging from about 150 to 1000 Å.

13. The method as set forth in claim 1, wherein the memory layer is formed using a spin coating process, an inkjet printing process, a roll-to-roll coating process, or a thermal deposition process.

14. The method as set forth in claim 1, wherein at least one solvent used for spin coating is selected from the group consisting of acetone, cyclopentanone, cyclohexanone, methylethylketone ethylcellosolveacetate, butylacetate, ethyleneglycol, toluene, xylene, chloroform, tetrahydrofuran, dimethylformamide, chlorobenzene and acetonitrile.

15. The method as set forth in claim 1, wherein the upper and lower electrode layers comprise a material selected from the group consisting of metals, metal oxides, conductive polymers, and organic conductors.

16. The method as set forth in claim 15, wherein the electrode layers comprise a material selected from the group consisting of aluminum, gold, silver, platinum, copper, titanium, tungsten, or indium tin oxide.

17. The method as set forth in claim 1, further comprising forming a barrier layer on the lower electrode layer of the substrate.

18. The method as set forth in claim 1, wherein the method comprises:
   forming a lower electrode layer on a substrate;
   forming a barrier layer on the lower electrode layer of the substrate;
   forming an organic material layer on the barrier layer;
   dipping the substrate, lower electrode layer, barrier layer and organic material into an ionic solution of conductive nanoparticles; and
   treating the dipped substrate, lower electrode layer, barrier layer and organic material with a reducing agent.

19. The method as set forth in claim 17, wherein the barrier layer comprises an inorganic material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$, or an organic material selected from the group consisting of Alq3, polymethylmethacrylate, polystyrene, and PET.

20. The method as set forth in claim 18, wherein the barrier layer comprises an inorganic material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$, or an organic material selected from the group consisting of Alq3, polymethylmethacrylate, polystyrene, and PET.

21. The method as set forth in claim 19, wherein the barrier layer comprises a material selected from the group consisting of $SiO_2$, $Al_2O_3$, $Cu_2O$, $TiO_2$, BN, and $V_2O_3$.

22. The method as set forth in claim 20, wherein the barrier layer comprises a material selected from the group consisting of $SiO_2$, $Al_2O_3$, $Cu_2O$, $TiO_2$, BN, and $V_2O_3$.

23. The method as set forth in claim 7, wherein the barrier layer has a thickness ranging from about 20 to 300 Å.

24. The method as set forth in claim 2, wherein the barrier layer has a thickness ranging from about 20 to 300 Å.

25. A nonvolatile organic memory device manufactured by the method of claim 1.

26. A nonvolatile organic memory device manufactured by the method of claim 18.

* * * * *